(12) United States Patent
Murakami (10) Patent No.: US 8,624,555 B2
(45) Date of Patent: Jan. 7, 2014

(54) VOLTAGE MONITORING SYSTEM, VOLTAGE MONITORING DEVICE, AND METHOD OF SETTING INFORMATION

(75) Inventor: Yoshihiro Murakami, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 338 days.

(21) Appl. No.: 13/033,061

(22) Filed: Feb. 23, 2011

(65) Prior Publication Data

US 2011/0215810 A1    Sep. 8, 2011

(30) Foreign Application Priority Data

Mar. 2, 2010   (JP) ................................. 2010-045569

(51) Int. Cl.
*H01M 10/44* (2006.01)
*H01M 10/46* (2006.01)

(52) U.S. Cl.
USPC ........................................................ 320/116

(58) Field of Classification Search
USPC ................. 320/107, 116, 118, 119, 134, 136; 324/426, 427, 433
See application file for complete search history.

(56) References Cited

U.S. PATENT DOCUMENTS

| 8,140,281 B2 | 3/2012 | Ishikawa et al. |
| 2008/0001593 A1* | 1/2008 | Odajima et al. ............. 324/105 |
| 2009/0319210 A1* | 12/2009 | Yanagisawa .................... 702/64 |

FOREIGN PATENT DOCUMENTS

JP     2009-017657 A     1/2009

* cited by examiner

*Primary Examiner* — Edward Tso
(74) *Attorney, Agent, or Firm* — Kubotera & Associates, LLC (57) ABSTRACT

A voltage monitoring system includes a plurality of voltage monitoring devices connected to each other in series for monitoring a voltage of each of battery units obtained by dividing per specific number a plurality of batteries connected in series. Each of the voltage monitoring devices includes a reception unit for receiving specific information transmitted from a former stage; a storage unit for storing the specific information received with the reception unit as self specific information; and a transmission unit for adding predetermined information to the specific information received with the reception unit, and for transmitting the specific information to a later stage as later stage specific information.

24 Claims, 7 Drawing Sheets

VOLTAGE MONITORING SYSTEM, VOLTAGE MONITORING DEVICE, AND METHOD OF SETTING INFORMATION

BACKGROUND OF THE INVENTION AND RELATED ART STATEMENT

The present invention relates to a voltage monitoring system, a voltage monitoring device of the voltage monitoring system, and a method of setting information in the voltage monitoring device of the voltage monitoring system. More specifically, the present invention relates to a voltage monitoring system capable of setting specific information for specifying the voltage monitoring device among a plurality of voltage monitoring devices; a voltage monitoring device of the voltage monitoring system, and a method of setting information in the voltage monitoring device of the voltage monitoring system.

An assembled battery has been widely installed in a vehicle, an electrical tool, and the likes. In the assembled battery, a plurality of secondary batteries is arranged and connected in series as a power source for driving a vehicle, an electrical tool, and the likes. When the assembled battery is installed in a hybrid motor vehicle or an electric vehicle as a power source for driving the hybrid motor vehicle or the electric vehicle, it is necessary to use the assembled battery having a large capacity. Accordingly, the assembled battery may be formed of secondary batteries in a range from a few tens to a few hundreds.

In the assembled battery, the secondary batteries may include a lithium ion battery, a lithium ion polymer secondary battery, and a nickel-hydrogen battery. In the following description, when it is not necessary to distinguish the secondary battery from other batteries such as a primary battery, the secondary battery is collectively referred to as a battery.

In general, a plurality of voltage monitoring devices is connected to a plurality of batteries of the assembled battery to be used as the drive power source, so that each of the voltage monitoring devices monitors a voltage value of each of the batteries. The voltage monitoring devices are connected in series. Further, a main device is provided for monitoring and controlling an operation of each of the voltage monitoring devices, so that the main device and the voltage monitoring devices constitute a voltage monitoring system.

Figure 7:
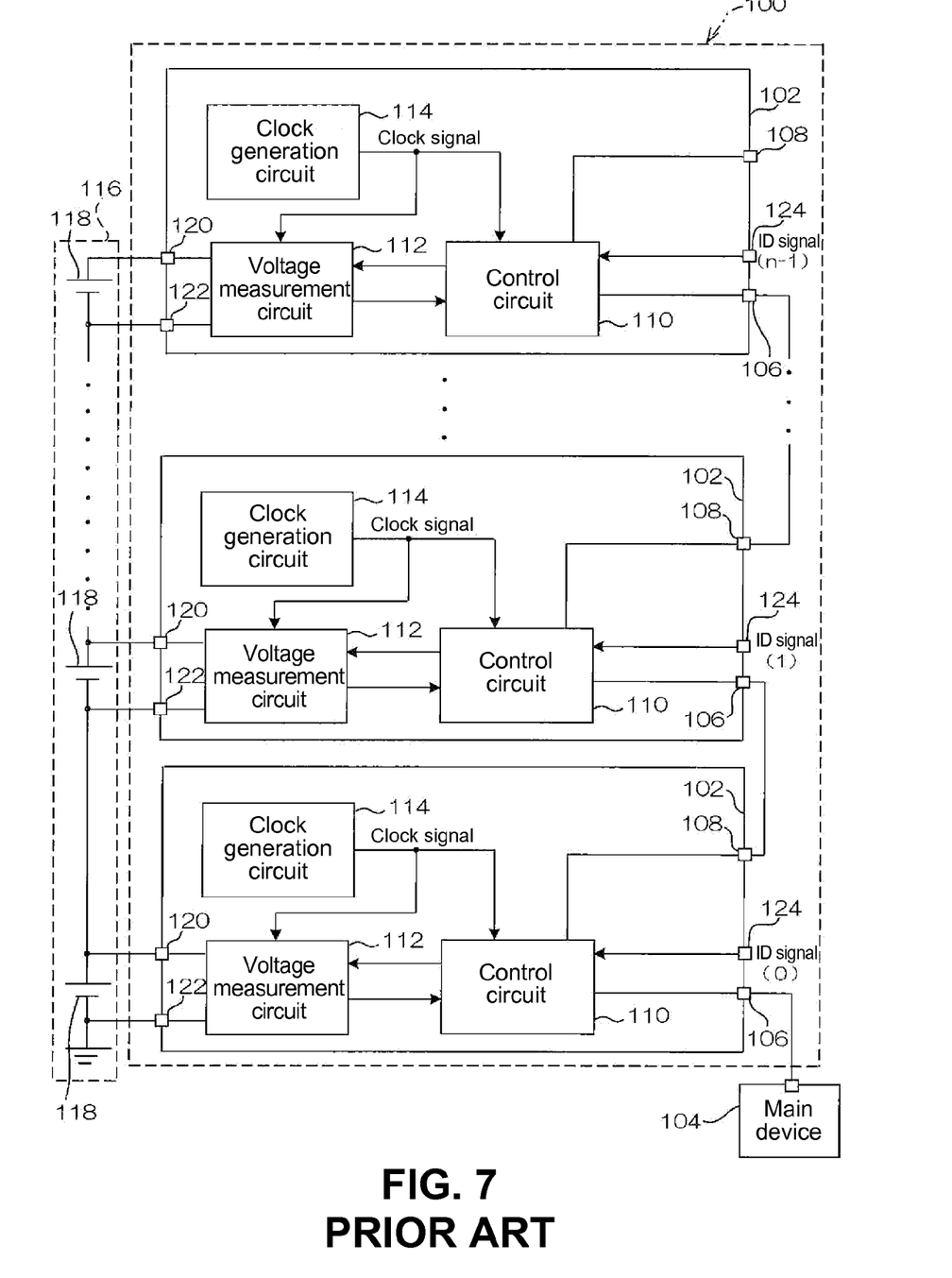
FIG. 7 is a block diagram showing a conventional voltage monitoring system.

FIG. 7 is a block diagram showing a conventional voltage monitoring system 100. As shown in FIG. 7, the conventional voltage monitoring system 100 includes a plurality of voltage monitoring devices 102 connected in series and a main device 104 for controlling an entire operation of the conventional voltage monitoring system 100 (refer to Patent Reference).
Patent Reference: Japanese Patent Publication No. 2009-17657

In the conventional voltage monitoring system 100, each of the voltage monitoring devices 102 includes communication terminals 106 and 108. The main device 104 is connected to the communication terminal 106, and the communication terminal 106 is connected to the communication terminal 108 of the voltage monitoring device 102 at a later stage. Accordingly, it is configured such that the main device 104 is capable of receiving and transmitting information with respect to all of the voltage monitoring devices 102 through the voltage monitoring device 102 directly connected to the main device 104.

In the conventional voltage monitoring system 100, each of the voltage monitoring devices 102 includes a control circuit 110, a voltage measurement circuit 112, and a clock generation circuit 114 connected to each other. The communication terminals 106 and 108 are separately connected to the control circuit 110. The control circuit 110 includes a CPU (Central Processing Unit), an ROM (Read Only Memory), an RAM (Random Access Memory), and a non-volatile storage medium such as an NVM (Non-Volatile Memory) for storing various types of information to be stored even after the voltage monitoring device 102 is turned off. The control circuit 110 is provided for controlling an entire operation of the voltage monitoring device 102.

In the conventional voltage monitoring system 100, the voltage measurement circuit 112 is provided for measuring a voltage of a power source according to an instruction of the control circuit 110. A plurality of batteries 118 is connected in series to constitute an assembled battery 116, and the voltage measurement circuit 112 is connected to one of the batteries 118.

More specifically, the voltage measurement circuit 112 is connected to a positive polarity terminal 118 of one of the batteries 118 through a positive polarity terminal 120 thereof. Further, the voltage measurement circuit 112 is connected to a negative polarity terminal of one of the batteries 118 through a negative polarity terminal 122 thereof. With the configuration described above, the voltage measurement circuit 112 measures a voltage of the corresponding battery 118.

In the conventional voltage monitoring system 100, the clock generation circuit 114 is provided for generating a clock signal for defining an operation timing of the control circuit 110 and the voltage measurement circuit 112. The clock generation circuit 114 is provided also for supplying the clock signal thus generated to the control circuit 110 and the voltage measurement circuit 112.

In the conventional voltage monitoring system 100, each of the voltage monitoring devices 102 further includes an ID input terminal 124 for receiving from an external device an input of specific information (referred to as an ID signal) for specifying the voltage monitoring device 102 thereof. The ID input terminal 124 is connected to the control circuit 110. When the voltage monitoring device 102 receives the ID signal from the external device through the ID input terminal 124, the ID signal is input to the control circuit 110, so that the ID signal is stored in the NVM. Accordingly, the specific ID signal is set in each of the voltage monitoring devices 102.

In the conventional voltage monitoring system 100 used for the assembled battery 116 to be installed in a motor vehicle, when the assembled battery 116 has a large capacity, it is necessary to increase the number of the batteries 118, i.e., the subject of the voltage monitoring. Accordingly, it is necessary to increase the number of the ID input terminals 124.

For example, when the conventional voltage monitoring system 100 includes 32 of the voltage monitoring devices 102 connected in series in multiple stages, each of the ID input terminals 124 is formed of cables in the number of five (a bit number). Accordingly, when a semiconductor circuit formed of a package having 30 pins to 56 pins is applied to the voltage monitoring device 102, it is difficult to apply the conventional voltage monitoring system 100 to the assembled battery 116 having a large capacity due to the restriction of the number of the ID input terminals 124.

In view of the problems described above, an object of the present invention is to provide a voltage monitoring system capable of setting specific information with respect to each of a plurality of voltage monitoring devices without disposing a special terminal in each of the voltage monitoring devices for setting the specific information. Further object of the present invention is to provide a voltage monitoring device of the voltage monitoring system and a method of setting information in the voltage monitoring device of the voltage monitoring system.

Further objects and advantages of the invention will be apparent from the following description of the invention.

SUMMARY OF THE INVENTION

In order to attain the objects described above, according to a first aspect of the present invention, a voltage monitoring system includes a plurality of voltage monitoring devices connected to each other in series for monitoring a voltage of each of a plurality of battery units obtained by dividing per specific number a plurality of batteries connected in series.

According to the first aspect of the present invention, each of the voltage monitoring devices includes a reception unit for receiving specific information transmitted from a former stage; a storage unit for storing the specific information received with the reception unit as self specific information; and a transmission unit for adding predetermined information to the specific information received with the reception unit, and for transmitting the specific information to a later stage as later stage specific information.

As described above, in the voltage monitoring system in the first aspect of the present invention, a plurality of the voltage monitoring devices connected to each other in series is provided for monitoring the voltage of each of the battery units obtained by dividing per specific number a plurality of the batteries connected in series. Each of the voltage monitoring devices includes the reception unit for receiving the specific information transmitted from the former stage.

Further, in the voltage monitoring system in the first aspect of the present invention, each of the voltage monitoring devices includes the storage unit for storing the specific information received with the reception unit as the self specific information; and the transmission unit for adding the predetermined information to the specific information received with the reception unit, and for transmitting the specific information to the later stage as the later stage specific information.

As described above, in the voltage monitoring system in the first aspect of the present invention, the voltage monitoring devices are connected to each other in series for monitoring the voltage of each of the battery units. Further, the reception unit receives the specific information transmitted from the former stage, and the storage unit stores the specific information thus received as the self specific information.

Further, the transmission unit adds the predetermined information to the specific information thus received, and transmits the specific information to the voltage monitoring device at the later stage as the later stage specific information. Accordingly, it is possible to set the specific information with respect to each of the voltage monitoring devices without disposing a special terminal in each of the voltage monitoring devices for setting specific information for specifying each of the voltage monitoring devices.

According to a second aspect of the present invention, a voltage monitoring system includes a plurality of voltage monitoring devices connected to each other in series for monitoring a voltage of each of a plurality of battery units obtained by dividing per specific number a plurality of batteries connected in series.

According to the second aspect of the present invention, each of the voltage monitoring devices includes a reception unit for receiving specific information transmitted from a former stage; a generation unit for adding predetermined information to the specific information received with the reception unit to generate self specific information; a storage unit for storing the self specific information generated with the generation unit; and a transmission unit for transmitting the self specific information generated with the generation unit to a later stage.

As described above, in the voltage monitoring system in the second aspect of the present invention, a plurality of the voltage monitoring devices connected to each other in series is provided for monitoring the voltage of each of the battery units obtained by dividing per specific number a plurality of the batteries connected in series. Each of the voltage monitoring devices includes the reception unit for receiving the specific information transmitted from the former stage; and the generation unit for adding the predetermined information to the specific information received with the reception unit to generate the self specific information.

Further, in the voltage monitoring system in the second aspect of the present invention, each of the voltage monitoring devices includes the storage unit for storing the specific information generated with the generation unit as the self specific information; and the transmission unit for transmitting the specific information generated with the generation unit to the later stage.

As described above, in the voltage monitoring system in the second aspect of the present invention, the voltage monitoring devices are connected to each other in series for monitoring the voltage of each of the battery units. Further, the reception unit receives the specific information transmitted from the former stage, and the generation unit adds the predetermined information to the specific information received with the reception unit to generate the self specific information.

Further, the storage unit stores the self specific information thus generated, and the transmission unit transmits the self specific information thus generated to the later stage. Accordingly, it is possible to set the specific information with respect to each of the voltage monitoring devices without disposing a special terminal in each of the voltage monitoring devices for setting specific information for specifying each of the voltage monitoring devices.

According to a third aspect of the present invention, in the voltage monitoring system in one of the first aspect and the second aspect of the present invention, each of the reception unit and the transmission unit is formed of a communication terminal for communicating with an external device. Accordingly, it is possible to set the specific information with respect to each of the voltage monitoring devices without disposing a special terminal in each of the voltage monitoring devices for setting specific information for specifying each of the voltage monitoring devices.

According to a fourth aspect of the present invention, in the voltage monitoring system in one of the first aspect to the third aspect of the present invention, the transmission unit or the generation unit is arranged to add a predetermined value as the predetermined information to the specific information. Accordingly, it is possible to easily generate the specific information.

According to a fifth aspect of the present invention, in the voltage monitoring system in the fourth aspect of the present invention, the transmission unit or the generation unit is arranged to add one as the predetermined value to the specific information. Accordingly, it is possible to set the specific information with respect to a large number of the voltage monitoring devices.

According to a sixth aspect of the present invention, in one of the first aspect to the fifth aspect of the present invention, the voltage monitoring system further includes a main device connected in series to the voltage monitoring device at the most front stage, so that the main device is situated at a former stage relative to the voltage monitoring device at the most front stage. The main device is provided for receiving and transmitting information from and to each of the voltage monitoring devices through the reception unit and the transmission unit. Accordingly, it is possible to acquire the information obtained with each of the voltage monitoring devices and control each of the voltage monitoring devices with a simple configuration.

According to a seventh aspect of the present invention, in the voltage monitoring system in the sixth aspect of the present invention, the main device is arranged to acquire voltage information indicating a monitored voltage from each of the voltage monitoring devices. Accordingly, it is possible to easily confirm a relative remaining capacity among the batteries.

According to an eighth aspect of the present invention, a voltage monitoring device is arranged to function as each of the voltage monitoring devices in the voltage monitoring system in one of the first aspect to the seventh aspect of the present invention.

As described above, in the eighth aspect of the present invention, the voltage monitoring device is arranged to function as each of the voltage monitoring devices in the voltage monitoring system in one of the first aspect to the seventh aspect of the present invention. Accordingly, when the voltage monitoring device is applied to the voltage monitoring system in the first aspect to the seventh aspect of the present invention, it is possible to obtain an effect similar to that of the voltage monitoring system in one of the first aspect to the seventh aspect of the present invention.

According to a ninth aspect of the present invention, a method is provided for setting specific information relative to each of a plurality of voltage monitoring devices of a voltage monitoring system, in which the voltage monitoring devices are connected to each other in series for monitoring a voltage of each of a plurality of battery units obtained by dividing per specific number a plurality of batteries connected in series.

According to the ninth aspect of the present invention, the method of setting the information includes a reception step of receiving specific information transmitted from a former stage with a reception unit disposed in each of the voltage monitoring devices; a storage step of storing the specific information received with the reception unit as self specific information in a storage unit disposed in each of the voltage monitoring devices; and a transmission step of adding predetermined information to the specific information received with the reception unit, and transmitting the specific information to a later stage as later stage specific information with a transmission unit disposed in each of the voltage monitoring devices.

In the ninth aspect of the present invention, the method of setting the information is performed similar to the voltage monitoring devices in the voltage monitoring system in one of the first aspect to the seventh aspect of the present invention. Accordingly, it is possible to obtain an effect similar to that in the voltage monitoring system in one of the first aspect to the seventh aspect of the present invention.

According to a tenth aspect of the present invention, a method is provided for setting specific information relative to each of a plurality of voltage monitoring devices of a voltage monitoring system, in which the voltage monitoring devices are connected to each other in series for monitoring a voltage of each of a plurality of battery units obtained by dividing per specific number a plurality of batteries connected in series.

According to the tenth aspect of the present invention, the method of setting the information includes a reception step of receiving specific information transmitted from a former stage with a reception unit disposed in each of the voltage monitoring devices; a generation step of adding predetermined information to the specific information received with the reception unit to generate self specific information with a generation unit disposed in each of the voltage monitoring devices; a storage step of storing the self specific information generated with the generation unit in a storage unit disposed in each of the voltage monitoring devices; and a transmission step of transmitting the self specific information generated with the generation unit to a later stage with a transmission unit disposed in each of the voltage monitoring devices.

In the tenth aspect of the present invention, the method of setting the information is performed similar to the voltage monitoring devices in the voltage monitoring system in one of the first aspect to the seventh aspect of the present invention. Accordingly, it is possible to obtain an effect similar to that in the voltage monitoring system in one of the first aspect to the seventh aspect of the present invention.

As described above, according to the present invention, it is possible to set the specific information with respect to each of the voltage monitoring devices without disposing a special terminal in each of the voltage monitoring devices for setting specific information for specifying each of the voltage monitoring devices.

DETAILED DESCRIPTION OF PREFERRED EMBODIMENTS

Hereunder, preferred embodiments of the present invention will be explained with reference to the accompanying drawings. In the following description, components similar to those of the conventional voltage monitoring system 100 and the assembled battery 116 shown in FIG. 7 are designated with the same reference numerals, and explanations thereof are omitted.

First Embodiment

Figure 1:
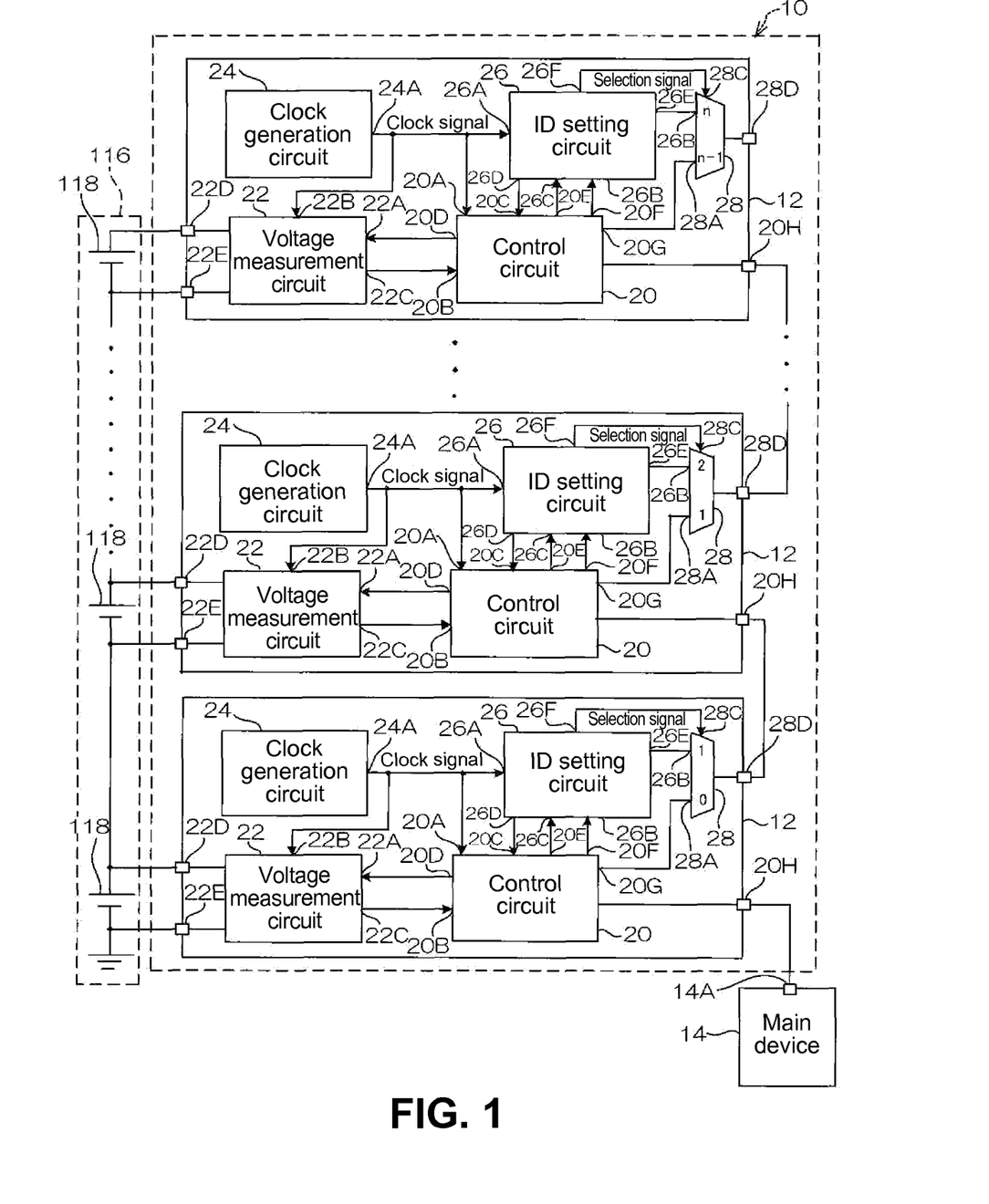
FIG. 1 is a block diagram showing a voltage monitoring system according to a first embodiment of the present invention.

A first embodiment of the present invention will be explained. FIG. 1 is a block diagram showing a voltage monitoring system 10 according to the first embodiment of the present invention.

As shown in FIG. 1, the voltage monitoring system 10 includes a plurality of voltage monitoring devices 12 for monitoring a voltage of each of the batteries 118. The voltage monitoring devices 12 are connected in series.

In the embodiment, a main device 14 is connected in series to the voltage monitoring device 12 at the most front stage, so that the main device 14 is situated at a former stage relative to the voltage monitoring device 12 at the most front stage. The main device 14 is provided for receiving voltage information (for example, a voltage value) indicating a voltage from each of the voltage monitoring devices 12, and for controlling an operation of each of the voltage monitoring devices 12.

In the embodiment, each of the voltage monitoring devices 12 is connected to each of the batteries 118 of the assembled battery 116 for monitoring a voltage value of each of the batteries 118. The voltage monitoring devices 12 are connected in series, so that the voltage monitoring devices 12 arranged adjacently are capable of communicating with each other. The voltage monitoring devices 12 of the voltage monitoring system 10 have an identical configuration. In the following description, the configuration of the voltage monitoring device 12 directly connected to the main device 14 will be explained as an example.

In the embodiment, the voltage monitoring device 12 includes communication terminals 20H and 28D. The communication terminal 20H is connected to a communication terminal 14A of the main device 14, and the communication terminal 28D is connected to the voltage monitoring device 12 at a later stage. Accordingly, it is configured such that the main device 14 is capable of receiving and transmitting information with respect to all of the voltage monitoring devices 12 through the voltage monitoring device 12 directly connected to the main device 14.

In the embodiment, the voltage monitoring device 12 includes a control circuit 20, a voltage measurement circuit 22, a clock generation circuit 24, an ID setting circuit 26, and a selection circuit 28.

In the voltage monitoring device 12, the control circuit 20 includes first to third input terminals 20A to 20C, first to fourth output terminals 20D to 20G, and a communication terminal 20H. The voltage measurement circuit 22 includes first and second input terminals 22A and 22B, an output terminal 22C, a positive polarity connection terminal 22D, and a negative polarity connection terminal 22D. The clock generation circuit 24 includes an output terminal 24A. The ID setting circuit 26 includes first to third input terminals 26A to 26C and first to third output terminals 26D to 26F. The selection circuit 28 includes first to third input terminals 28A to 28C and a communication terminal 28D.

In the embodiment, the control circuit 20 includes a CPU (Central Processing Unit), an ROM (Read Only Memory), an RAM (Random Access Memory), and a non-volatile storage medium such as an NVM (Non-Volatile Memory) for storing various types of information to be stored even after the voltage monitoring device 102 is turned off. The control circuit 20 is provided for controlling an entire operation of the voltage monitoring device 12.

In the embodiment, the second input terminal 20B of the control circuit 20 is connected to the output terminal 22C of the voltage measurement circuit 22. The first output terminal 20D of the control circuit 20 is connected to the first input terminal 22A of the voltage measurement circuit 22. The fourth output terminal 20G of the control circuit 20 is connected to the first input terminal 28A of the selection circuit 28. The communication terminal 20H of the control circuit 20 is connected to the communication terminal 14A of the main device 14. Accordingly, the control circuit 20 is capable of controlling an operation of the voltage measurement circuit 22, acquiring information from the voltage measurement circuit 22, outputting information to the selection circuit 28, and receiving and transmitting with the main device 14.

In the embodiment, the voltage measurement circuit 22 is provided for measuring a voltage of a power source according to an instruction of the control circuit 20. More specifically, the positive polarity connection terminal 22D of the voltage measurement circuit 22 is connected to a positive polarity terminal of corresponding one of the batteries 118, and the negative polarity connection terminal 22E of the voltage measurement circuit 22 is connected to a negative polarity terminal of corresponding one of the batteries 118, so that the voltage measurement circuit 22 is capable of measuring a voltage of corresponding one of the batteries 118.

In the embodiment, the clock generation circuit 24 is provided for generating a clock signal (a CLK signal) for defining an operation timing of the control circuit 20, the voltage measurement circuit 22, and the ID setting circuit 26 of the voltage monitoring device 12. The output terminal 24A of the clock generation circuit 24 is connected to the first input terminal 20A of the control circuit 20, the second input terminal 22B of the voltage measurement circuit 22, the second input terminal 22B of the voltage measurement circuit 22, and the first input terminal 26A of the ID setting circuit 26.

Accordingly, the clock generation circuit 24 is arranged to generate the clock signal for defining the operation timing of the control circuit 20, the voltage measurement circuit 22, and the ID setting circuit 26 of the voltage monitoring device 12, and to supply the clock signal thus generated to the control circuit 20, the voltage measurement circuit 22, and the ID setting circuit 26 of the voltage monitoring device 12.

In the embodiment, the second input terminal 26B of the ID setting circuit 26 is connected to the third output terminal 20F of the control circuit 20. The third input terminal 26C of the ID setting circuit 26 is connected to the second output terminal 20E of the control circuit 20. The second output terminal 26E of the ID setting circuit 26 is connected to the second input terminal 28B of the selection circuit 28. The third output terminal 26F of the ID setting circuit 26 is connected to the third input terminal 28C of the selection circuit 28. Accordingly, the ID setting circuit 26 is capable of setting an ID signal of the voltage monitoring device 12, and for controlling the selection circuit 28 according to an instruction of the control circuit 20.

In the embodiment, the communication terminal 28D of the selection circuit 28 is connected to the communication terminal 20H of the voltage monitoring device 12 connected to the voltage monitoring device 12 of the selection circuit 28. Accordingly, the selection circuit 28 is capable of selecting one of the information input from the control circuit 20 and the information input from the ID setting circuit 26 according to an instruction of the control circuit 20, and is capable of receiving and transmitting information between the voltage monitoring device 12 and the voltage monitoring device 12 of the selection circuit 28.

Figure 2:
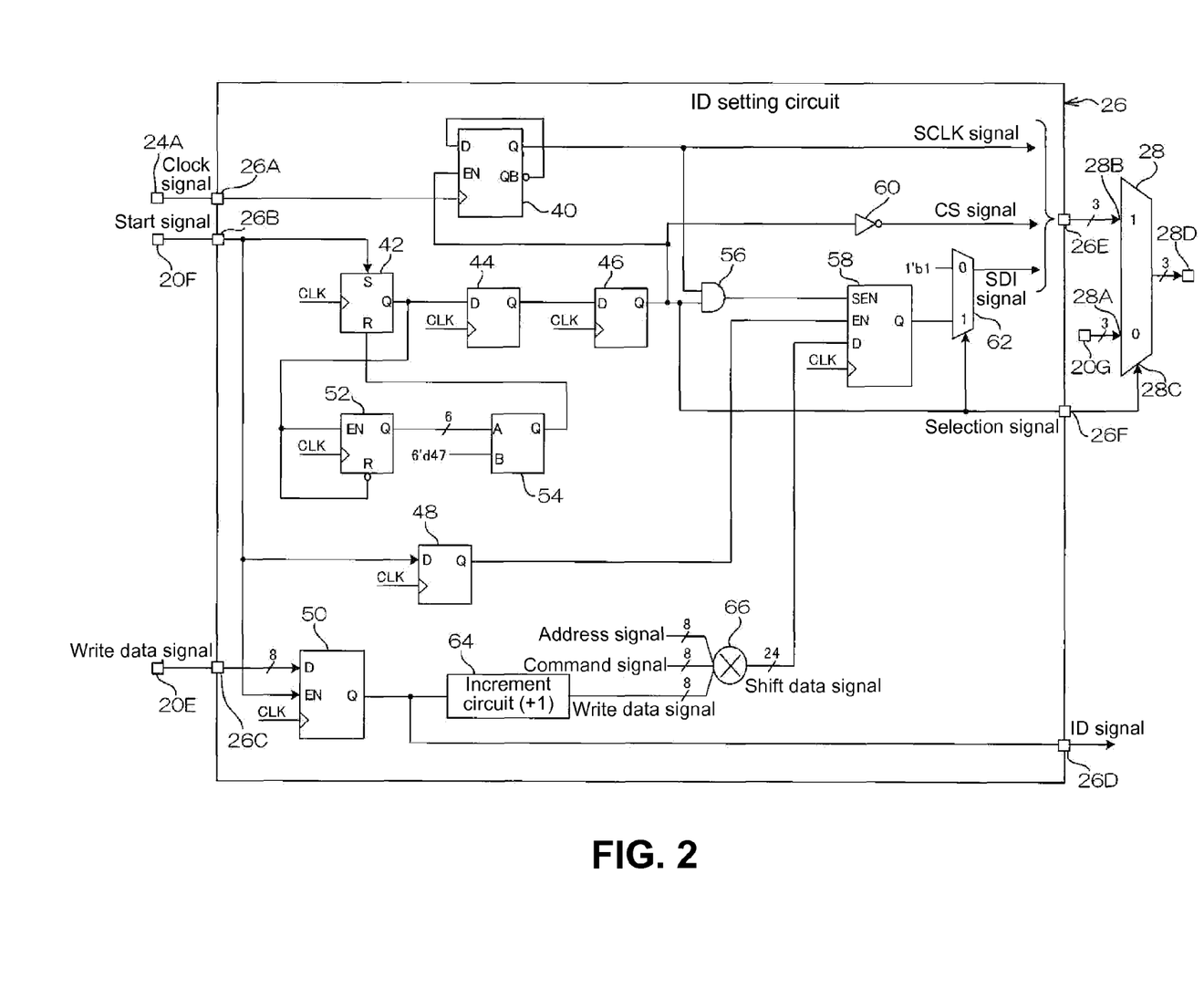
FIG. 2 is a block diagram showing an ID setting circuit and a selection circuit of the voltage monitoring system according to the first embodiment of the present invention.

FIG. 2 is a block diagram showing the ID setting circuit 26 and the selection circuit 28 of the voltage monitoring system 10 according to the first embodiment of the present invention.

As shown in FIG. 2, the ID setting circuit 26 includes a divider circuit 40, a first holding circuit 42, a second holding circuit 44, a third holding circuit 46, a fourth holding circuit 48, a fifth holding circuit 50, a counter circuit 52, a comparison circuit 54, an AND circuit 56, a shift register 58, an inversion circuit 60, a multiplexer circuit 62, an increment circuit 64, and a bus connection circuit 66.

In the embodiment, the divider circuit 40 includes a clock signal input terminal, a D terminal representing a signal input terminal for inputting a signal; a Q terminal representing a signal output terminal for outputting a signal; a QB terminal representing an inverse signal outputting terminal for outputting an inverse signal of the signal output from the Q terminal; and an EN terminal representing an enable terminal.

In the embodiment, the first holding circuit 42 includes a clock signal input terminal, an S terminal representing a set input terminal; an R terminal representing a reset input terminal; and a Q terminal representing a data output terminal. Each of the second holding circuit 44, the third holding circuit 46, and the fourth holding circuit 48 includes a clock signal input terminal, the D terminal, and the Q terminal. The fifth holding circuit 50 includes a clock signal input terminal, the D terminal, the Q terminal, and the EN terminal.

In the embodiment, the counter circuit 52 includes the clock signal input terminal, the Q terminal, the EN terminal, and the R terminal. The comparison circuit 54 includes the Q terminal, and an A terminal and a B terminal representing signal input terminals for inputting various signals. The AND circuit 56 includes a first input terminal, a second input terminal, and an output terminal. The shift register 58 includes an SEN terminal representing a shift operation enable terminal, the EN terminal, the D terminal, the clock signal input terminal, and the Q terminal. Each of the inversion circuit 60 and the increment circuit 64 includes an input terminal and an output terminal. The multiplexer circuit 62 includes an output terminal and first to third input terminals. The bus connection circuit 66 includes an output terminal and first to third terminals.

In the embodiment, the clock signal input terminal of the divider circuit 40 is connected to the first input terminal 26A, and the Q terminal of the divider circuit 40 is connected to the second output terminal 26E and the first input terminal of the AND circuit 56. Further, the EN terminal of the divider circuit 40 is connected to the second input terminal of the AND circuit 56 and the input terminal of the inversion circuit 60, and the QB terminal of the divider circuit 40 is connected to the D terminal of the divider circuit 40. Accordingly, when the clock signal is input into the clock signal input terminal of the divider circuit 40 from the clock generation circuit 24 through the first input terminal 26A, the divider circuit 40 converts the clock signal to a serial clock signal (an SCLK signal) with a specific frequency, and outputs the serial clock signal from the Q terminal thereof.

In the embodiment, the clock signal input terminal of the first holding circuit 42 is connected to the first input terminal 26A (connection is not shown in FIG. 2), and the S terminal of the first holding circuit 42 is connected to the second input terminal 26B. Further, the Q terminal of the first holding circuit 42 is connected to the D terminal of the second holding circuit 44 and the EN terminal of the counter circuit 52, and the R terminal of the first holding circuit 42 is connected to the Q terminal of the comparison circuit 54. Accordingly, when a high level signal is input into the S terminal of the first holding circuit 42 from the control circuit 20 through the second input terminal 26B as a start signal for starting the ID setting circuit 26, the first holding circuit 42 outputs the high level signal from the Q terminal thereof.

In the embodiment, the clock signal input terminal of the second holding circuit 44 is connected to the first input terminal 26A (connection is not shown in FIG. 2), and the Q terminal of the first holding circuit 42 is connected to the D terminal of the third holding circuit 46. Accordingly, when the high level signal is input from the first holding circuit 42, the second holding circuit 44 outputs the high level signal from the Q terminal thereof.

In the embodiment, the clock signal input terminal of the third holding circuit 46 is connected to the first input terminal 26A (connection is not shown in FIG. 2), and the Q terminal of the first holding circuit 42 is connected to the second input terminal of the AND circuit 56, the first input terminal of the multiplexer circuit 62, and the third output terminal 26F. Accordingly, when the high level signal is input from the second holding circuit 44, the third holding circuit 46 outputs the high level signal as a selection signal from the Q terminal thereof, thereby constituting a delay circuit together with the second holding circuit 44.

In the embodiment, the clock signal input terminal of the fourth holding circuit 48 is connected to the first input terminal 26A (connection is not shown in FIG. 2), and the D terminal of the fourth holding circuit 48 is connected to the second input terminal 26B. Further, the Q terminal of the fourth holding circuit 48 is connected to the EN terminal of the shift register 58. Accordingly, when the high level signal as the start signal is input into the D terminal of the fourth holding circuit 48 from the control circuit 20 through the second input terminal 26B, the fourth holding circuit 48 outputs the high level signal from the Q terminal thereof.

In the embodiment, the clock signal input terminal of the fifth holding circuit 50 is connected to the first input terminal 26A (connection is not shown in FIG. 2), and the D terminal of the fifth holding circuit 50 is connected to the third input terminal 26C. Further, the EN terminal of the fifth holding circuit 50 is connected to the second input terminal 26B, and the Q terminal of the fifth holding circuit 50 is connected to the input terminal of the increment circuit 64 and the first output terminal 26D. Accordingly, when a write data signal with 8 bit representing information (for example, an ID signal) to be set relative to the voltage monitoring device 12 is input into the D terminal of the fifth holding circuit 50 from the control circuit 20 through the third input terminal 26C, the fifth holding circuit 50 outputs the write data signal from the Q terminal thereof.

In the embodiment, the clock signal input terminal of the counter circuit 52 is connected to the first input terminal 26A (connection is not shown in FIG. 2), and the R terminal of the counter circuit 52 is connected to the EN terminal of the counter circuit 52. Further, the Q terminal of the counter circuit 52 is connected to the A terminal of the comparison circuit 54. Accordingly, when the high level signal is output from the Q terminal of the first holding circuit 42, the counter circuit 52 starts a count-up operation.

In the embodiment, it is configured such that a predetermined value with 6 bit (for example, data indicating 47 in the decimal numeration system) is input into the B terminal of the comparison circuit 54. When a count value of the counter circuit 52 reaches a predetermined value, the comparison circuit 54 outputs from the Q terminal thereof a high level signal as a count end signal indicating the count value of the counter circuit 52 reaches the predetermined value.

In the embodiment, the output terminal of the AND circuit 56 is connected to the SEN terminal of the shift register 58. When the high level signal is input from the divider circuit 40, and the high level signal is input from the third holding circuit 46, the AND circuit 56 outputs the high level signal from the output terminal thereof.

In the embodiment, the clock signal input terminal of the shift register 58 is connected to the first input terminal 26A (connection is not shown in FIG. 2), and the D terminal of the shift register 58 is connected to the output terminal of the bus connection circuit 66. Further, the Q terminal of the counter circuit 52 is connected to the second input terminal of the multiplexer circuit 62. Accordingly, when the signal is input from the bus connection circuit 66, the shift register 58 outputs the signal per one bit from the Q terminal thereof.

In the embodiment, the output terminal of the inversion circuit 60 is connected to the second output terminal 26E. Accordingly, when the signal is input from the divider circuit 40, the inversion circuit 60 inverts the signal, and outputs a chip select signal (a CS signal) from the output terminal thereof.

In the embodiment, it is configured such that a predetermined value with one bit (for example, data indicating one in the binary numeration system) is input into the third input terminal of the multiplexer circuit 62. The output terminal of the multiplexer circuit 62 is connected to the second output terminal 26E. When a plurality of signals is input, the multiplexer circuit 62 combines the signals and outputs one single serial data signal (an SDI signal).

In the embodiment, the output terminal of the increment circuit 64 is connected to the first input terminal of the bus connection circuit 66. Accordingly, when the write data signal is input from the fifth holding circuit 50, the increment circuit 64 adds one to a value indicated with the write data signal, and outputs an updated data signal (a new write data signal) from the output terminal thereof.

In the embodiment, it is configured such that a command signal with 8 bit (for example, a signal indicating write access) for instructing an operation content of the ID setting circuit 26 is input into the second input terminal of the bus connection circuit 66. Further, it is configured such that an address signal (for example, an address assigned to an arbitrary circuit of the voltage monitoring device 12) is input into the third input terminal of the bus connection circuit 66. Accordingly, the bus connection circuit 66 outputs a shift data signal obtained through combining the address signal, the command signal, and the updated data signal.

In the embodiment, according to a signal with three bit input into the second input terminal 28B from the ID setting circuit 26 through the second output terminal 26E, a signal with three bit input into the first input terminal 28A from the control circuit 20 through the fourth output terminal 20G, and the selection signal input into the third input terminal 28C from the third holding circuit 46 through the third output terminal 26F, the selection circuit 28 is provided for outputting a serial data output signal (an SDO signal) from the communication terminal 28D to the voltage monitoring device 12 at the later stage.

As described above, in the voltage monitoring system 10 in the embodiment, an SPI (Serial Peripheral Interface) communication is applied for communicating between the voltage monitoring device 12 and between the voltage monitoring device 12 and the main device 14. The SPI communication is performed according to the CS signal, the SCLK signal, the SDI signal, and the SDO signal.

Figure 3:
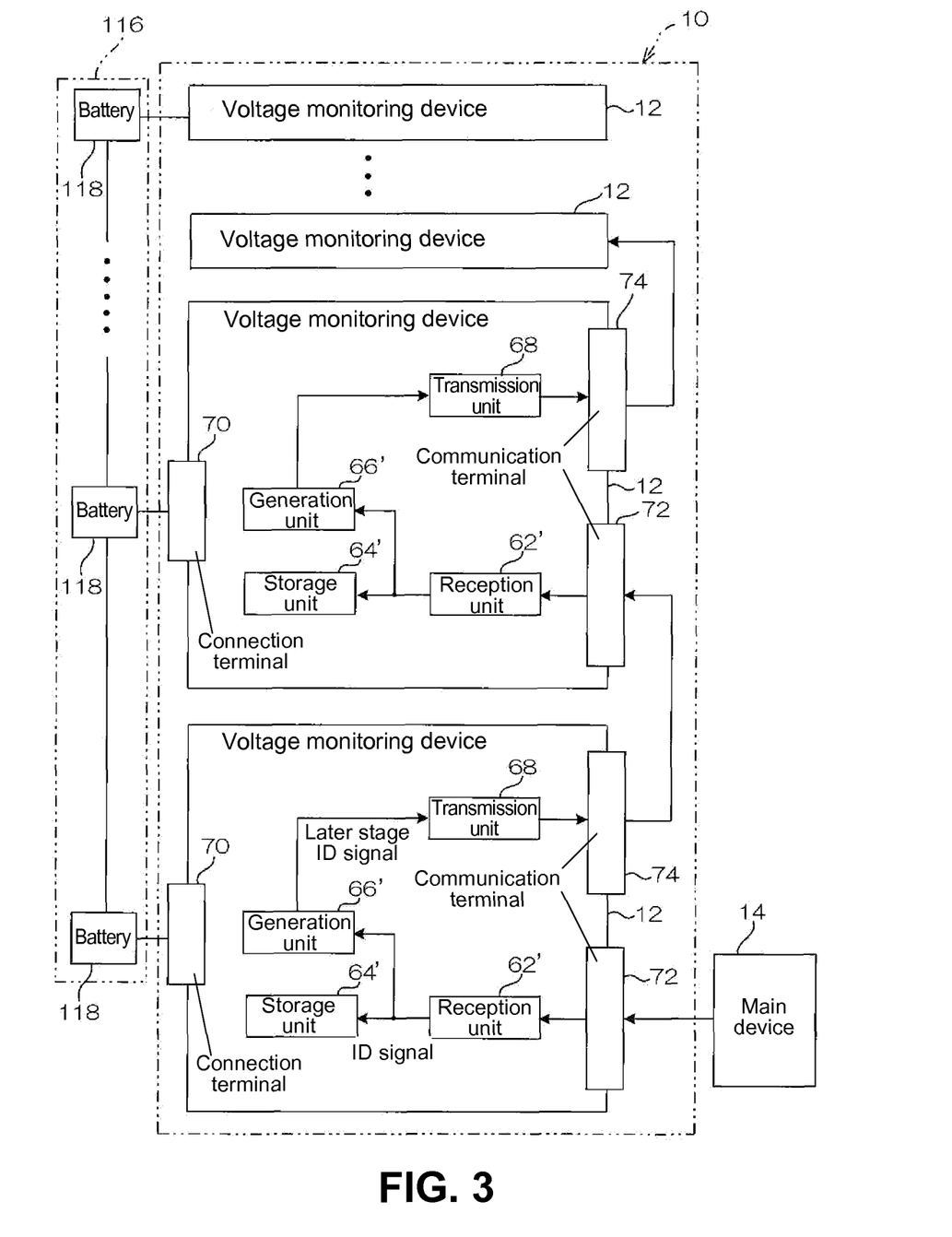
FIG. 3 is a block diagram showing a main portion of the voltage monitoring system according to the first embodiment of the present invention.

FIG. 3 is a block diagram showing a main portion of the voltage monitoring system 10 according to the first embodiment of the present invention.

As shown in FIG. 3, each of the voltage monitoring devices 12 includes a reception unit 62', a storage unit 64', a generation unit 66', a transmission unit 68, a connection terminal 70, and communication terminals 72 and 74.

In the embodiment, referring to FIG. 1, the reception unit 62' corresponds to the control circuit 20; storage unit 64' and generation unit 66' correspond to the ID setting circuit 26; the transmission unit 68 corresponds to the selection circuit 28; the communication terminal 72 corresponds to the communication terminal 20H; the communication terminal 74 corresponds to the communication terminal 28D, and the connection terminal 70 corresponds to the positive polarity connection terminal 22D and the negative polarity connection terminal 22E.

In the embodiment, an output terminal of the reception unit 62' is connected to an input terminal of storage unit 64' and an input terminal of generation unit 66'. An output terminal of generation unit 66' is connected to an input terminal of the transmission unit 68. The communication terminal 74 as an output terminal of the transmission unit 68 is connected to the communication terminal 72 of the voltage monitoring device 12 at the later stage.

In the embodiment, an output terminal of the main device 14 is connected to an input terminal of the reception unit 62' through the communication terminal 72. Accordingly, the main device 14 transmits the ID signal of the voltage monitoring device 12 to the voltage monitoring device 12 to which the main device 14 is directly connected.

In the embodiment, each of the voltage monitoring devices 12 is connected to the corresponding battery 118 through the connection terminal 70, so that the voltage monitoring device 12 is capable of measuring a voltage value of the battery 118. More specifically, each of the voltage monitoring devices 12 measures a voltage value of the corresponding battery 118 at a specific interval (for example, 0.1 second), and stores the voltage value in an internal memory (not shown) in an overwriting manner. Each of the voltage monitoring devices 12 outputs the voltage value to the main device 14 through the communication terminal 72 according to an instruction from the main device 14. Accordingly, the main device 14 is capable of acquiring information obtained with each of the voltage monitoring devices 12 (for example, the voltage value of the battery 118).

In the embodiment, the reception unit 62' is provided for receiving the ID signal transmitted from the main device 14. Then, storage unit 64' outputs the ID signal thus received to storage unit 64' as well as generation unit 66'.

In the embodiment, storage unit 64' is provided for storing the ID signal input from the reception unit 62' as specific information (referred to as a self ID signal) for specifying the voltage monitoring device 12 thereof into a predetermined storage area. Accordingly, it is possible to set the ID signal specific to the voltage monitoring device 12.

In the embodiment, generation unit 66' is provided for adding predetermined information to the ID signal input from the reception unit 62'. Accordingly, generation unit 66' is capable of generating an ID signal (referred to as a later stage ID signal) to be set relative to the voltage monitoring device 12 arranged at the later stage of the voltage monitoring device 12 thereof, and of outputting the later stage ID signal to the transmission unit 68. The transmission unit 68 is provided for transmitting the later stage ID signal input from generation unit 66' to the voltage monitoring device 12 at the later stage through the communication terminal 74.

In the embodiment, in the voltage monitoring devices 12 connected in series at the later stages, the self ID signal is set similar to the process described above. Further, the later stage ID signal is generated as the ID signal of the voltage monitoring devices 12 with the ID signal not set yet, so that the later stage ID signal thus generated is output.

Figure 4:
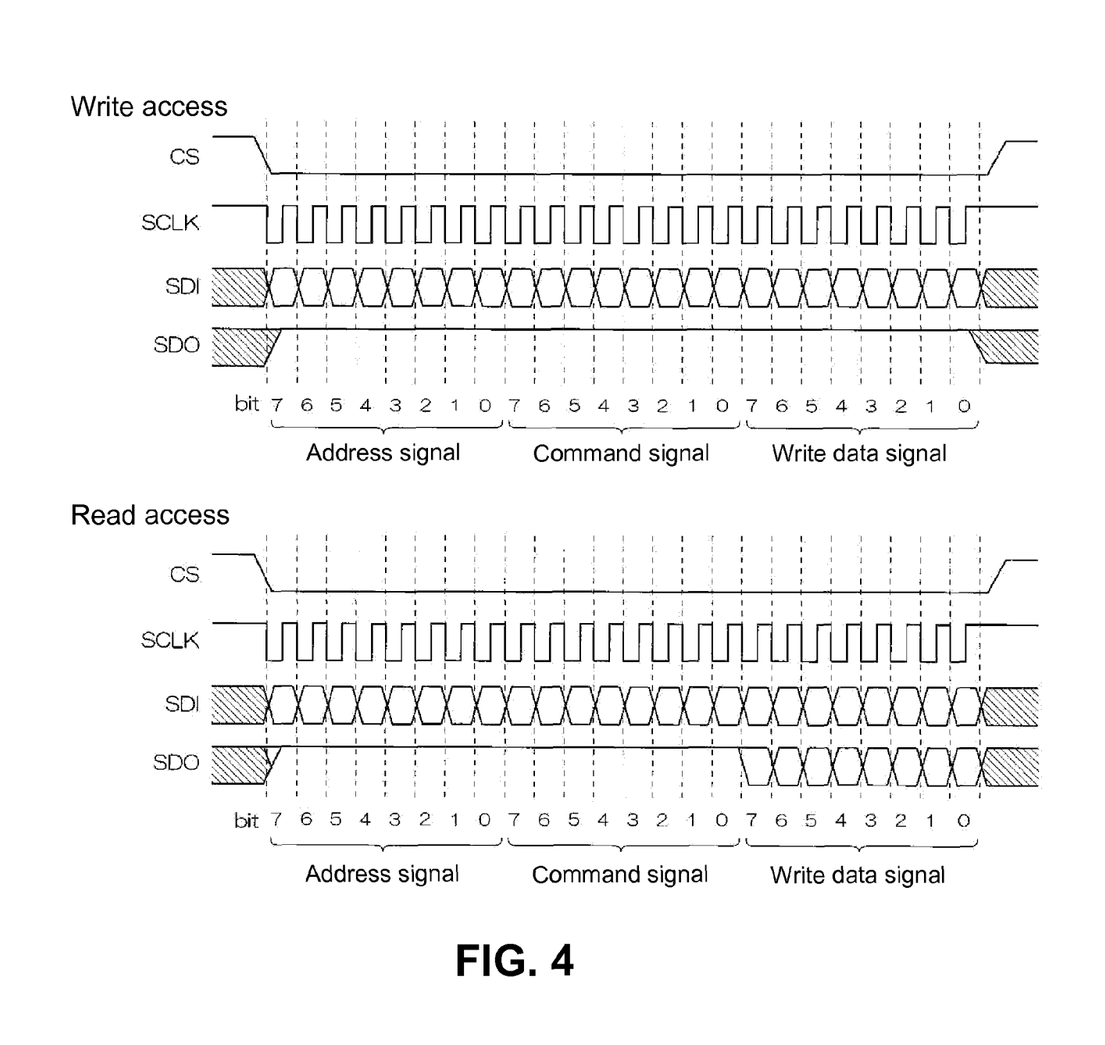
FIG. 4 is a time chart showing an operation of the voltage monitoring system in an SPI communication according to the first embodiment of the present invention.

An operation of the voltage monitoring system 10 will be explained. First, the SPI communication applied to the voltage monitoring system 10 will be explained with reference to FIG. 4. FIG. 4 is a time chart showing the operation of the voltage monitoring system 10 in the SPI communication according to the first embodiment of the present invention.

In the following description, as an example, it is supposed that the specific ID signal is set to each of the voltage monitoring devices 12. Further, the main device 14 outputs the CS signal, the SCLK signal, and the SDI signal as well as the command signal including the ID signal and the address signal from the communication terminal 14A thereof.

As shown in FIG. 4, when the main device 14 executes a write access for writing information into the voltage monitoring device 12, first, the control circuit 20, the voltage measurement circuit 22, and the ID setting circuit 26 of the voltage monitoring device 12 directly connected to the main device 14 obtain the CS signal, the SCLK signal, and the SDI signal input from the main device 14. When the CS signal input from the main device 14 is at a low level, the control circuit 20 obtains the SDI signal at a rising edge of the SCLK signal, so that the control circuit 20 acquires the address signal, the command signal, and the write data signal. In the next step, the control circuit 20 of the voltage monitoring device 12 performs a writing process for writing the information only in the predetermined storage area of the voltage monitoring device 12 matching to the ID signal contained in the command signal.

In the embodiment, when the main device 14 executes a read access for reading information from the voltage monitoring device 12, and the CS signal input from the main device 14 is at a low level, the control circuit 20 obtains the SDI signal at the rising edge of the SCLK signal, so that the control circuit 20 acquires the address signal and the command signal. Then, according to the address signal and the command signal specified with the main device 14, the control circuit 20 of the voltage monitoring device 12 matching to the ID signal contained in the command signal performs a reading process for reading the information from the predetermined storage area to read the read data signal. After the control circuit 20 of the voltage monitoring device 12 performs the reading process, the control circuit 20 of the voltage monitoring device 12 outputs the read data as the SDO signal to the main device 14.

Figure 5:
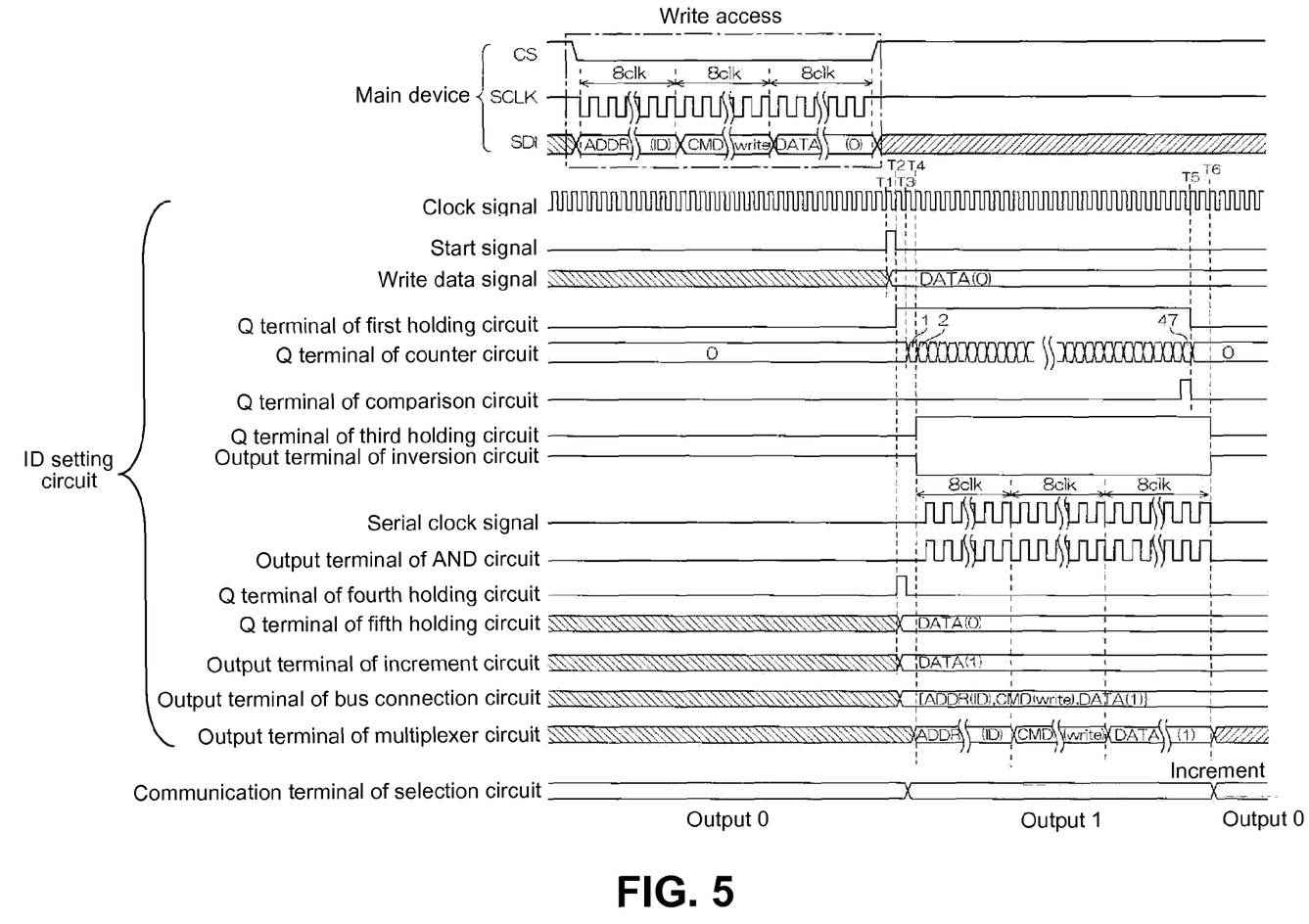
FIG. 5 is a time chart showing an operation of the ID setting circuit of the voltage monitoring device according to the first embodiment of the present invention.

Next, an operation of the voltage monitoring system 10 for setting the ID signal relative to the voltage monitoring devices 12 will be explained with reference to FIG. 5. FIG. 5 is a time chart showing an operation of the ID setting circuit 26 of the voltage monitoring device 12 according to the first embodiment of the present invention. In the following description, it is supposed that the ID signal is not set to each of the voltage monitoring devices 12 yet.

As shown in FIG. 5, first, the main device 14 performs the write access to an address specifying the ID setting circuit 26 of the voltage monitoring device 12, and outputs the write data signal indicating a value "0". It is noted that the write data signal functions as a trigger signal for setting the ID signal to each of the voltage monitoring devices 12.

In the embodiment, when the control circuit 20 of the voltage monitoring device 12 detects the write access, the control circuit 20 transits the start signal from the low level signal to the high level signal to start the ID setting circuit 26. At the same time, the control circuit 20 outputs the write data signal indicating the value "0" and input from the main device 14 to the ID setting circuit 26. Accordingly, at a timing T1, the write data signal at the third input terminal 26C of the ID setting circuit 26 changes to "0".

In the embodiment, when the start signal becomes the high level signal, the first holding circuit 42 outputs the high level signal from the Q terminal thereof, and the fourth holding circuit 48 and the fifth holding circuit 50 acquire the high level signal as the start signal. Accordingly, the fourth holding circuit 48 outputs the high level signal from the Q terminal thereof. Further, the fifth holding circuit 50 retrieves the write data signal with the value "0", so that the write data signal is set as the ID signal of the voltage monitoring device 12 thereof. Then, the fifth holding circuit 50 outputs the write data signal to the storage unit 64'.

In the embodiment, when the storage unit 64' receives the write data signal from the fifth holding circuit 50, the storage unit 64' adds one to the value "0" indicated with the write data signal input from the fifth holding circuit 50, and outputs the write data signal to the generation unit 66'. At a timing T2, the generation unit 66' combines the address signal, the command signal, and the write data signal with the value "1" input from the storage unit 64' to generate the shift data signal with 24 bit, and outputs the shift data signal to the D terminal of the shift register 58.

In the embodiment, at a timing T3, when the high level signal is input into the counter circuit 52 from the Q terminal of the first holding circuit 42, the counter circuit 52 starts a count up operation.

In the embodiment, at a timing T4, when a count up value of the counter circuit 52 changes from "1" to "2", the third holding circuit 46 outputs the high level signal as the selection signal from the Q terminal thereof. At the same time, the inversion circuit 60 changes the high level signal input from the Q terminal of the third holding circuit 46 to the low level signal, and outputs the low level signal as the CS signal.

In the embodiment, at a timing T5, when the counter circuit 52 counts up to a predetermined value (for example, 47), the counter circuit 52 controls the comparison circuit 54 to output the high level signal from the Q terminal of the comparison circuit 54, so that the high level signal output from the Q terminal of the first holding circuit 42 at that time is transited to the low level signal. Accordingly, at a timing T6, the third holding circuit 46 transits the high level signal output from the Q terminal thereof at that time to the low level signal, so that the inversion circuit 60 transits the low level signal output from the output terminal thereof to the high level signal.

In the embodiment, during a period of time from when the selection signal becomes the high level signal to when the selection signal returns to the low level signal, i.e., a period of time from the timing T4 to the timing T6, the CS signal, the SCLK signal, the address signal indicating the address of the ID setting circuit 26 of the voltage monitoring device 12 connected thereto, the command signal indicating the write access, and the SDI signal containing the write data signal with the value "1" are output to the voltage monitoring device 12 with the ID signal at the later stage at that time, i.e., the voltage monitoring device 12 connected thereto with the ID signal not set yet.

In the embodiment, when the high level signal is input from the fourth holding circuit 48 to the EN terminal of the shift register 58, the shift register 58 retrieves the shift data signal from the bus connection circuit 66 through the D terminal thereof. Accordingly, when the high level signal is input from the AND circuit 56, the shift data signal is retrieved, and the SDI signal is generated and output per one bit from the address signal.

As described above, in the first embodiment, after the ID signal indicating the specific value is set to the voltage monitoring device 12, the voltage monitoring device 12 adds one to the specific value to generate the new ID signal, and outputs the new ID signal as the later stage ID signal to the voltage monitoring device 12 at the later stage. Accordingly, the specific ID signal is set to each of the voltage monitoring devices 12 in the serial connection order from the voltage monitoring device 12 at the most front stage directly connected to the main device 14.

Accordingly, in the voltage monitoring system 10 in the first embodiment, it is not necessary to provide an ID setting special terminal in each of the voltage monitoring devices 12 for setting the ID signal as opposed to the conventional voltage monitoring system. Further, the communication terminals 20H and 28D are provided for communicating with the external device such as the main device 14, and function as the ID setting special terminal as well.

Further, when the conventional voltage monitoring system is used for monitoring an assembled battery with a large capacity, it is difficult to provide an external interface for adding various functions due to the restriction of the number of the terminals. On the other hand, in the voltage monitoring system 10 in the first embodiment, as described above, it is not necessary to provide an ID setting special terminal in each of the voltage monitoring devices 12. Accordingly, it is possible to expand freedom of the terminal arrangement, and it is possible to provide an external interface for adding various functions.

For example, when the bit number of input/output signals of the fifth holding circuit 50 of the ID setting circuit 26 is 8 bit, it is possible to connect 256 of the voltage monitoring devices 12 in series at multiple stages, and it is possible to provide an external interface in each of the voltage monitoring devices 12.

As described above, in the voltage monitoring system 10 in the first embodiment, the voltage monitoring devices 12 are connected in series for monitoring the voltage of each of the batteries 118 connected in series. The control unit 20 of the voltage monitoring device 12 receives the ID signal transmitted from the voltage monitoring device 12 at the former stage, and stores and sets the ID signal in the fifth holding circuit 50 as the self ID signal. Further, the increment circuit 64 adds "1" as the predetermined information to the ID signal thus received, so that the ID signal is transmitted to the voltage monitoring device 12 at the later stage as the later stage ID signal. Accordingly, it is possible to set the ID signal in each of the voltage monitoring devices 12 without providing a special terminal for setting the ID signal for specifying each of the voltage monitoring devices 12.

Further, in the voltage monitoring system 10 in the first embodiment, "1" as the predetermined information is added to the self ID signal to generate the later stage ID signal. Accordingly, it is possible to assign the specific ID signal to each of the voltage monitoring devices 12 with the minimum bit number. As a result, it is possible to set the ID signal in a large number of the voltage monitoring devices 12. Further, it is possible to transmit and receive the ID signal with a minimum number of signal lines.

Further, in the voltage monitoring system 10 in the first embodiment, the main device 14 is connected in series to the voltage monitoring device 12 at the most front stage, so that the main device 14 is situated at a former stage relative to the voltage monitoring device 12 at the most front stage. The main device 14 is provided for receiving and transmitting the information with respect to each of the voltage monitoring devices 12. Accordingly, it is possible to confirm the information collected with the voltage monitoring devices 12, and for controlling the voltage monitoring devices 12 with the simple configuration.

Further, in the voltage monitoring system 10 in the first embodiment, the main device 14 is provided for collecting the voltage information indicating the voltage to be monitored from each of the voltage monitoring devices 12. Accordingly, it is possible to easily confirm a relative remaining amount of the batteries 118.

Second Embodiment

A second embodiment of the present invention will be explained next. In the first embodiment, the voltage monitoring device 12 sets the ID signal input from outside as the self ID signal. Then, the voltage monitoring device 12 generates and outputs the later stage ID signal to the voltage monitoring device 12 at the later stage, so that the specific ID signal is set to each of the voltage monitoring devices 12.

In the second embodiment, the specific ID signal is set to each of voltage monitoring devices 12A with a different process. Components in the second embodiment similar to those in the first embodiment are designated with the same reference numerals, and explanations thereof are omitted. In the following description of the second embodiment, only differences from the first embodiment will be explained.

Figure 6:
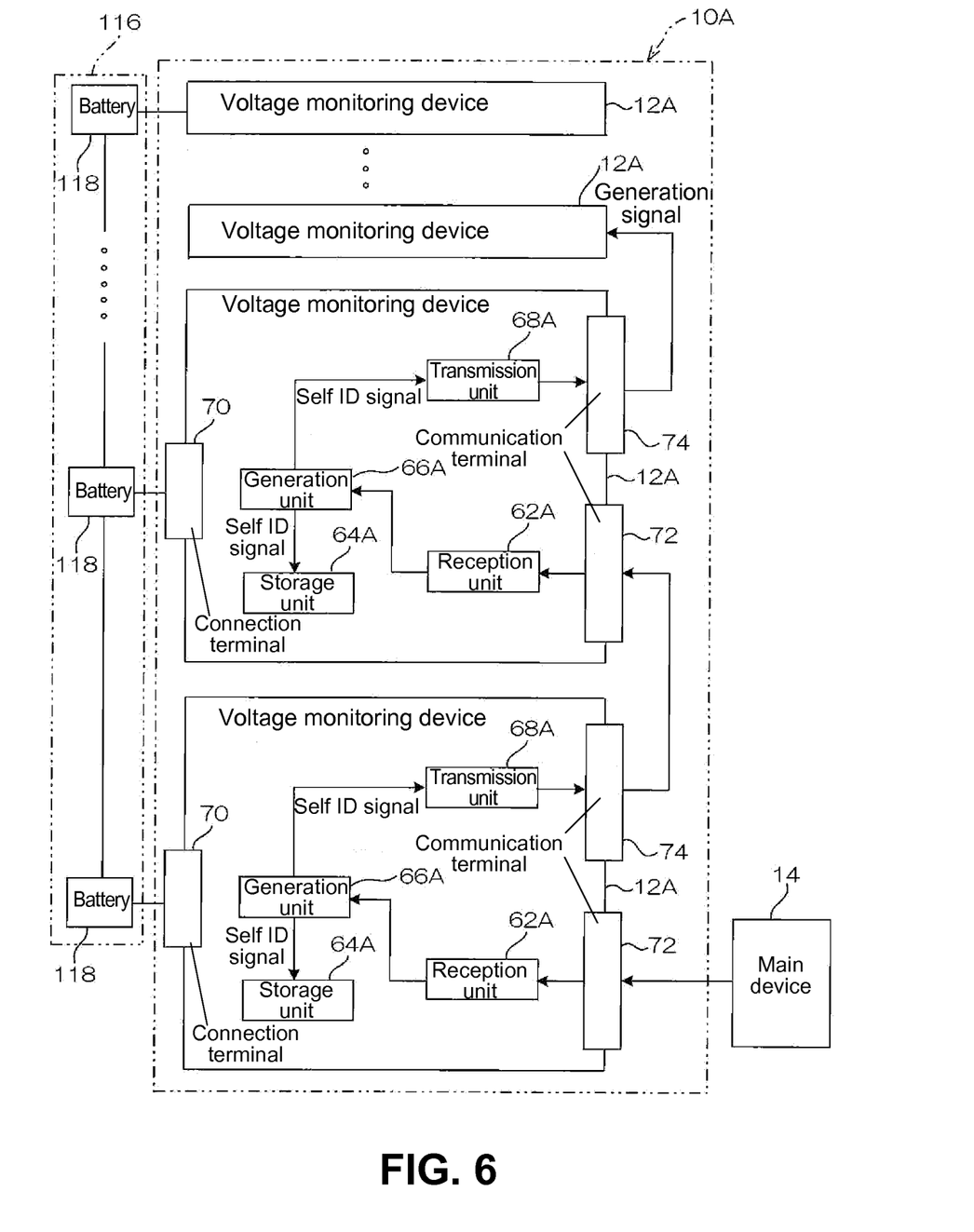
FIG. 6 is a block diagram showing a main portion of a voltage monitoring system according to a second embodiment of the present invention.

FIG. 6 is a block diagram showing a main portion of a voltage monitoring system 10A according to the second embodiment of the present invention. As shown in FIG. 6, instead of the voltage monitoring devices 12 of the voltage monitoring system 10 in the first embodiment, the voltage monitoring system 10A includes the voltage monitoring devices 12A.

In the second embodiment, as opposed to the voltage monitoring devices 12 in the first embodiment, each of the voltage monitoring devices 12A includes a reception unit 62A instead of the reception unit 62', a storage unit 64A instead of storage unit 64', a generation unit 66A instead of generation unit 66', and a transmission unit 68A instead of the transmission unit 68.

In the second embodiment, an output terminal of the reception unit 62A is connected to an input terminal of the generation unit 66A. An output terminal of the generation unit 66A is connected to an input terminal of the transmission unit 68A. Another output terminal of the generation unit 66A is connected to an input terminal of the storage unit 64A. The communication terminal 74 as an output terminal of the transmission unit 68A is connected to the communication terminal 72 of the voltage monitoring device 12A at the later stage.

In the second embodiment, the output terminal of the main device 14 is connected to an input terminal of the reception unit 62A through the communication terminal 72. Accordingly, the main device 14 transmits a generation signal for generating the ID signal of the voltage monitoring device 12A to the voltage monitoring device 12A to which the main device 14 is directly connected.

In the embodiment, the reception unit 62A is provided for receiving the ID signal transmitted from the main device 14. Then, the storage unit 64A outputs the ID signal thus received to the generation unit 66A.

In the embodiment, the generation unit 66A is provided for adding predetermined information (for example, a signal indicating the value "1") to the generation signal input from the reception unit 62A. Accordingly, the generation unit 66A is capable of generating and outputting the self ID signal to the storage unit 64A. Further, the generation unit 66A is capable of outputting the ID signal to 68a as the generating signal for generating the later stage ID of the voltage monitoring device 12A arranged at the later stage.

In the embodiment, the storage unit 64A is provided for storing the ID signal input from the generation unit 66A as the specific information for specifying the voltage monitoring device 12A thereof into a predetermined storage area. Accordingly, it is possible to set the specific ID signal to the voltage monitoring device 12A. The transmission unit 68 is provided for transmitting the later stage ID signal input from the generation unit 66A to the voltage monitoring device 12A at the later stage through the communication terminal 74.

In the second embodiment, in the voltage monitoring devices 12A connected in series at the later stages, the generation signal as the self ID signal is set similar to the process described above. Further, in the voltage monitoring devices 12A at the later stages, the self ID signal is set and the generation signal is generated, so that the generation signal is transmitted.

As described above, in the second embodiment, after the voltage monitoring device 12A receives the generation signal from the former stage, the voltage monitoring device 12A adds one to the generation signal thus received to generate the new generation signal, and the new generation signal is stored in the storage unit 64A as the self ID signal. Then, the voltage monitoring device 12A outputs the self ID signal as the generation signal for generating the later stage ID signal to the voltage monitoring device 12A at the later stage. Accordingly, the specific ID signal is set to each of the voltage monitoring devices 12A in the serial connection order from the voltage monitoring device 12A at the most front stage directly connected to the main device 14.

As described above, in the voltage monitoring system 10A in the second embodiment, the voltage monitoring devices 12A are connected in series for monitoring the voltage of each of the batteries 118 connected in series. The control unit 20 of the voltage monitoring device 12A receives the ID signal transmitted from the voltage monitoring device 12A at the former stage, and the predetermined information is added to the ID signal thus received to generate the self ID signal, so that the self ID signal is stored and set in the predetermined storage area. Further, the self ID signal thus generated is transmitted to the voltage monitoring device 12A at the later stage. Accordingly, it is possible to set the ID signal in each of the voltage monitoring devices 12A without providing a special terminal for setting the ID signal for specifying each of the voltage monitoring devices 12A.

In the first and second embodiments described above, the voltage monitoring devices 12 or the voltage monitoring devices 12A are provided for monitoring the voltage values of the batteries 118. Alternatively, the voltage monitoring devices 12 or the voltage monitoring devices 12A may be connected to the assembled battery 116, in which the batteries 118 are divided into a specific number such as two and three to form battery units. Accordingly, the voltage monitoring devices 12 or the voltage monitoring devices 12A may be provided for monitoring voltage values of the battery units.

Further, in the first and second embodiments described above, the voltage monitoring devices 12 or the voltage monitoring devices 12A are provided for monitoring the voltage values of the batteries 118 as the secondary batteries. Alternatively, the voltage monitoring devices 12 or the voltage monitoring devices 12A may be connected in series to primary batteries functioning as the assembled battery.

Further, in the first and second embodiments described above, "1" is added to the ID signal to generate the new ID signal. Alternatively, a value other than "1" such as "2" may be added to the ID signal to generate the new ID signal.

The disclosure of Japanese Patent Application No. 2010-045569, filed on Mar. 2, 2010, is incorporated in the application by reference.

While the invention has been explained with reference to the specific embodiments of the invention, the explanation is illustrative and the invention is limited only by the appended claims.

What is claimed is:

1. A voltage monitoring system comprising:
a plurality of voltage monitoring devices connected to each other in series for monitoring a voltage of each of a plurality of battery units, wherein each of said voltage monitoring devices comprises:
a reception unit for receiving specific information transmitted from a former stage;
a storage unit for storing the specific information as self specific information; and
a transmission unit for adding predetermined information to the specific information, and for transmitting the specific information to a later stage as later stage specific information, or
each of said voltage monitoring devices comprises:
a reception unit for receiving specific information transmitted from a former stage;
a generation unit for adding predetermined information to the specific information to generate self specific information;
a storage unit for storing the self specific information; and
a transmission unit for transmitting the self specific information to a later stage.

2. The voltage monitoring system according to claim 1, wherein said reception unit and said transmission unit are formed of a communication terminal for communicating with an external device.

3. The voltage monitoring system according to claim 1, wherein said transmission unit is arranged to add a predetermined value as the predetermined information to the specific information.

4. The voltage monitoring system according to claim 3, wherein said transmission unit is arranged to add one as the predetermined value to the specific information.

5. The voltage monitoring system according to claim 1, further comprising a main device connected in series to the voltage monitoring device at a most front stage for communicating with the voltage monitoring devices.

6. The voltage monitoring system according to claim 5, wherein said main device is arranged to acquire voltage information indicating the voltage from each of the voltage monitoring devices.

7. A voltage monitoring device arranged to function as each of the voltage monitoring devices in the voltage monitoring system according to claim 1.

8. A method for setting specific information relative to each of a plurality of voltage monitoring devices of a voltage monitoring system, in which the voltage monitoring devices are connected to each other in series for monitoring a voltage of each of a plurality of battery units, comprising:
a reception step of receiving the specific information transmitted from a former stage with a reception unit disposed in each of the voltage monitoring devices;
a storage step of storing the specific information as self specific information in a storage unit disposed in each of the voltage monitoring devices; and
a transmission step of adding predetermined information to the specific information and transmitting the specific information to a later stage as later stage specific information with a transmission unit disposed in each of the voltage monitoring devices, or
a reception step of receiving the specific information transmitted from a former stage with a reception unit disposed in each of the voltage monitoring devices;
a generation step of adding predetermined information to the specific information to generate self specific information with a generation unit disposed in each of the voltage monitoring devices;

a storage step of the self specific information in a storage unit disposed in each of the voltage monitoring devices; and a transmission step of transmitting the self specific information to a later stage with a transmission unit disposed in each of the voltage monitoring devices.

9. A voltage monitoring system comprising:

a plurality of voltage monitoring devices connected to each other in series for monitoring a voltage of each of a plurality of battery units connected to each other in series; and a main device connected in series to one of the voltage monitoring devices at a most front stage so that the main device is configured to output address information to the one of the voltage monitoring devices, wherein each of said voltage monitoring devices includes an address generation unit, and said address generation unit is arranged to set the address information as self specific information, and add specific information to the address information to be output to a later stage, or said address generation unit is arranged to add specific information to the address information to be set as self specific information, and add the specific information to the address information to be output to a later stage.

10. The voltage monitoring system according to claim 9, wherein said address generation unit is arranged to add one as the specific information to an address of the address information.

11. The voltage monitoring system according to claim 9, wherein each of said voltage monitoring devices includes a control unit for controlling an operation of each of the voltage monitoring devices and a selection unit for selecting one of an output from the control unit and an output from the address generation unit to be output to the later stage.

12. The voltage monitoring system according to claim 11, wherein, said selection unit is arranged to output the one of the output from the control unit and the output from the address generation unit through a same terminal thereof.

13. The voltage monitoring system according to claim 11, wherein said address generation unit is arranged to output a selection signal, and said selection unit is arranged to select the one of the output from the control unit and the output from the address generation unit according to the selection signal.

14. The voltage monitoring system according to claim 13, wherein said address generation unit includes a selection signal output period setting unit for setting an output period of the selection signal.

15. The voltage monitoring system according to claim 14, wherein said selection signal output period setting unit is arranged to set the output period that starts with a start signal output from the control unit.

16. The voltage monitoring system according to claim 11, wherein said address generation unit includes a delay unit for delaying the selection signal from inputting to the selection unit.

17. A voltage monitoring device connected to each other in series for monitoring a voltage of each of a plurality of battery units connected to each other in series per a predetermined number of the battery units, comprising:

an address generation unit arranged to set the address information as self specific information, and add specific information to the address information to be output to a later stage, or arranged to add specific information to the address information to be set as self specific information, and add the specific information to the address information to be output to a later stage.

18. The voltage monitoring device according to claim 17, wherein said address generation unit is arranged to add one as the specific information to an address of the address information.

19. The voltage monitoring device according to claim 17, wherein each of said voltage monitoring devices includes a control unit for controlling an operation of each of the voltage monitoring devices and a selection unit for selecting one of an output from the control unit and an output from the address generation unit to be output to the later stage.

20. The voltage monitoring device according to claim 19, wherein said selection unit is arranged to output the one of the output from the control unit and the output from the address generation unit through a same terminal thereof.

21. The voltage monitoring device according to claim 19, wherein said address generation unit is arranged to output a selection signal, and said selection unit is arranged to select the one of the output from the control unit and the output from the address generation unit according to the selection signal.

22. The voltage monitoring device according to claim 21, wherein said address generation unit includes a selection signal output period setting unit for setting an output period of the selection signal.

23. The voltage monitoring device according to claim 22, wherein said selection signal output period setting unit is arranged to set the output period that starts with a start signal output from the control unit.

24. The voltage monitoring device according to claim 19, wherein said address generation unit includes a delay unit for delaying the selection signal from inputting to the selection unit.

* * * * *